(12) United States Patent
Fujimoto et al.

(10) Patent No.: US 7,537,864 B2
(45) Date of Patent: May 26, 2009

(54) HOLE PATTERN DESIGN METHOD AND PHOTOMASK

(75) Inventors: Masashi Fujimoto, Kanagawa (JP); Seiji Matsuura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 831 days.

(21) Appl. No.: 11/020,131

(22) Filed: Dec. 27, 2004

(65) Prior Publication Data

US 2005/0142454 A1 Jun. 30, 2005

(30) Foreign Application Priority Data

Dec. 26, 2003 (JP) .............................. 2003-433493

(51) Int. Cl.
  G03F 1/00 (2006.01)
  G03F 1/14 (2006.01)
  G06F 17/50 (2006.01)

(52) U.S. Cl. ............................................. 430/5; 716/20

(58) Field of Classification Search ...................... 430/5; 716/19–20
See application file for complete search history.

(56) References Cited

U.S. PATENT DOCUMENTS

| | | | |
|---|---|---|---|
| 5,867,253 A | 2/1999 | Nakae | |
| 6,150,059 A | 11/2000 | Tanabe | |
| 6,586,341 B2 | 7/2003 | Moniwa | |
| 6,593,214 B1 | 7/2003 | Igarashi | |
| 6,686,108 B2 | 2/2004 | Inoue | |
| 7,376,931 B2* | 5/2008 | Kokubun | ........................ 430/5 |
| 2002/0177050 A1* | 11/2002 | Tanaka | ........................ 430/5 |
| 2004/0166422 A1* | 8/2004 | Yamazoe et al. | ............... 430/5 |

FOREIGN PATENT DOCUMENTS

| | | |
|---|---|---|
| JP | 10-104818 | 4/1998 |
| JP | 11-135402 | 5/1999 |
| JP | 2002-122976 | 4/2002 |
| JP | 2002-353102 | 12/2002 |
| JP | 2003-188111 | 7/2003 |
| JP | 2003-241362 | 8/2003 |

* cited by examiner

*Primary Examiner*—Mark F Huff
*Assistant Examiner*—John Ruggles
(74) *Attorney, Agent, or Firm*—Young & Thompson (57) ABSTRACT

A method of designing hole patterns for arranging hole patterns on a pattern drawing of a photomask used during an exposure process in semiconductor integrated circuit manufacturing, wherein a grid is provided on the pattern drawing with a space smaller than a minimum pitch allowed by the design rule of the semiconductor integrated circuit, and the hole patterns are provided at lattice points, which are the intersections of the grid. Flexibility of hole pattern arrangement is improved and the quality of hole pattern arrangement can be easily evaluated.

10 Claims, 8 Drawing Sheets

HOLE PATTERN DESIGN METHOD AND PHOTOMASK

FIELD OF THE INVENTION

This invention relates to a photomask used for forming hole patterns such as contact holes and via holes during an exposure process in semiconductor integrated circuit manufacturing process and to a hole pattern design method for deciding the arrangement of the hole patterns on the photomask.

BACKGROUND OF THE INVENTION

A conventional method for arranging hole patterns is described below:

FIG. 8 shows pattern drawings showing examples of hole pattern arrangement formed on a photomask.

Figure 8A:
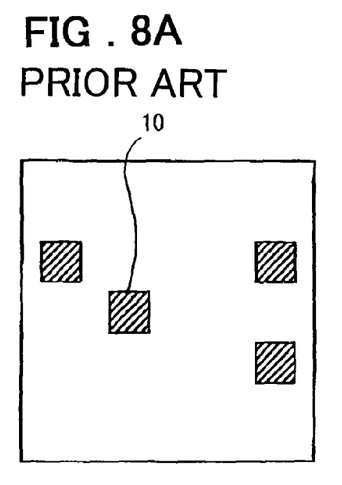
FIGS. 8A, 8B, 8C and 8D show pattern drawings showing examples of conventional hole pattern arrangement.

As shown in FIG. 8A, since a focus margin is not broad enough in the layout where hole patterns 10 are arranged arbitrarily, an arrangement of auxiliary patterns, which are not transferred onto a photoresist layer during an exposure process, is necessary. (Refer to Patent Document 1 for example.)

Figure 8B:
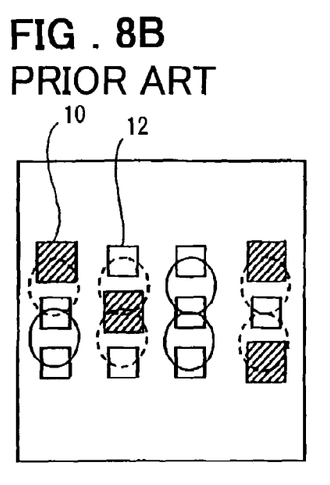

As shown in FIG. 8B, in the case where auxiliary patterns 12 are arranged as densely as possible, problems where the auxiliary patterns are transferred onto a photoresist layer during an exposure process and the auxiliary patterns are connected with each other at the positions indicated by solid lines can occur. Also, problems where the shapes of the hole patterns 10 transferred onto a photoresist layer are distorted and the hole patterns 10 and the auxiliary patterns 12 are connected at the positions indicated by broken lines can occur.

Figure 8C:
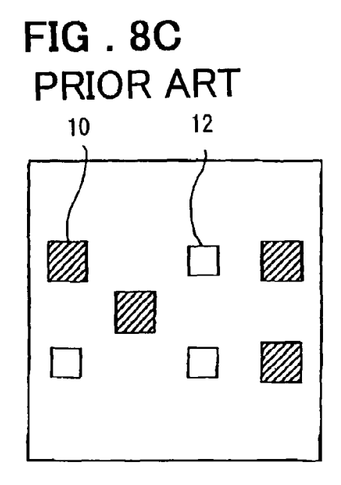

On the other hand, if the minimum necessary numbers of the auxiliary patterns 12 are provided as shown in FIG. 8C, the problems described above can be avoided, but the effect of broadening the focus margin cannot be fully obtained.

The size of the auxiliary patterns 12 should be approximately 80% of the size of the hole patterns from the standpoints of the manufacturing accuracy of a reticle, which is going to be a photomask, the defect inspection accuracy, and the effect of broadening a transfer margin and the focus margin. Also, the distance between the gravity centers of the hole patterns 10 and the auxiliary patterns 12 must be approximately the same as the densest pitch, which is the minimum value of the distance between the gravity centers of the hole patterns 10 from the standpoint of the effect of broadening the focus margin.

Figure 8D:
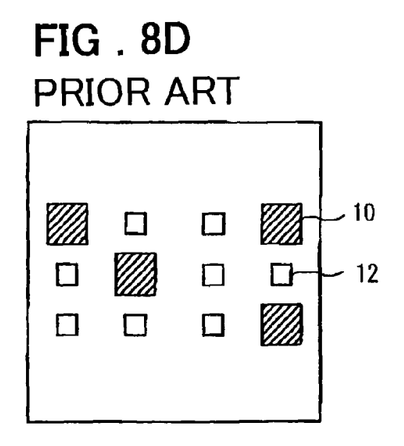

Further, it is known that the effect of broadening the focus margin cannot be fully obtained unless the arrangement of the auxiliary patterns 12 is isotropic in all directions as much as possible. In order to achieve this, techniques such as adjusting the size of the auxiliary patterns 12 and adjusting the distance between the auxiliary patterns 12 and the hole patterns 10 are employed. In FIG. 8D, the size of the auxiliary patterns 12 is decreased. FIGS. 8B through 8D show the auxiliary patterns 12 provided around the center of the pattern drawing.

[Patent Document 1]
Japanese Patent Kokai Publication No. JP-A-11-135402

SUMMARY OF THE DISCLOSURE

As explained above, even if techniques such as adjusting the size of auxiliary patterns or adjusting the distance between the auxiliary patterns and hole patterns are employed, problems such as a transfer of the auxiliary patterns and distortion of hole pattern shape occur.

Furthermore, when devising a realistic application of auxiliary patterns to hole patterns that are arranged arbitrarily, the work is expected to be extremely complicated and troublesome because the auxiliary pattern size and a layout including distances between the patterns have to be optimized for each pattern.

As explained, when arranging hole patterns and auxiliary patterns, it is difficult not only to arrange them, but also to secure a broad enough focus margin. Therefore, there is much to be desired in the art.

The problems described above stem from the fact that the focus margin of fine hole patterns depends heavily on the density of its layout. Also, a dense layout where the density of hole patterns is high and a sparse layout where the density is low require remarkably different optimal exposure conditions (optical conditions, etc.) and it is essentially impossible to expose the both layouts under the same conditions and have patterns formed on a photoresist layer.

The present invention aims at solving the problems of the conventional technology described above, and its object is to improve the flexibility of hole pattern arrangement and provide a method of designing hole patterns where the quality of a hole pattern arrangement is easily evaluated, and a photomask made by this method.

According to a first aspect of the present invention, there is provided a method of designing hole patterns for arranging hole patterns on a pattern drawing of a photomask used during an exposure process in semiconductor integrated circuit manufacturing. A grid is provided on a pattern drawing with a space smaller than a minimum pitch allowed by the design rule of said semiconductor integrated circuit, and the hole patterns are provided at lattice points, which are intersections of the grid.

According to the first aspect, it is possible to provide hole patterns at the lattice points of a grid whose space is smaller than a minimum pitch allowed by a design rule, therefore it is also possible to fine-tune the distances between the patterns where the space between the hole patterns tend to be too wide under the conventional technology. As a result, the uniformity of the overall optical conditions for a pattern drawing improves compared to the conventional technology, and so does its focus margin.

Furthermore, in the method of designing hole patterns described above, auxiliary patterns, which are patterns not transferred onto a photoresist layer during the exposure process, is provided at lattice points located at a distance not less than the minimum pitch from the gravity center of the hole pattern, excluding the lattice points at which the hole patterns are provided.

In the present invention, by keeping the distance between the gravity centers of a hole pattern and an auxiliary pattern not less than the minimum pitch, the interval between the lattice points of each pattern can be as long as the minimum pitch. As a result, the influence of a proximity effect becomes more uniform and a focus margin is improved.

In the method of designing hole patterns described above, the space of the grid can be half of the minimum pitch.

According to second aspect of the present invention, there is provided a method of designing hole patterns the method comprises: arranging hole patterns and auxiliary patterns on a pattern drawing of a photomask used during an exposure process in semiconductor integrated circuit manufacturing, wherein the patterns of the auxiliary patterns are not transferred onto a photoresist layer during an exposure process, and the hole patterns and auxiliary patterns are arranged so that a side of a similar pattern obtained by enlarging each of the hole patterns and the auxiliary patterns by a prescribed multiplier, centering its gravity center so that each pattern overlaps with other similar patterns.

In this aspect of the present invention, since each pattern is arranged so that similar patterns obtained by enlarging each pattern by a prescribed multiplier overlap with each other, an arrangement of an isolated pattern, which is too far away from the patterns surrounding it, is forbidden. Therefore, the patterns are arranged uniformly and a focus margin is improved. In this case, the value of the multiplier can be 3.

According to a third aspect, there is a method of designing hole patterns. The method comprises: arranging hole patterns and auxiliary patterns on a pattern drawing of a photomask used during an exposure process in semiconductor integrated circuit manufacturing, wherein the patterns of the auxiliary pattern are not transferred onto a photoresist layer during the exposure process, and the hole patterns and auxiliary patterns are arranged so that when a unit graphic is a square whose side is three times as long as the densest pitch, which is the minimum value of the distance between the gravity centers of the hole patterns, and when the auxiliary pattern is replaced by the hole pattern, the area of hole patterns within the unit graphic placed at an optional position on the pattern drawing is 60% or larger of the area of the maximum number of the hole patterns that can be arranged within the unit graphic.

In the present invention, since a pattern area within a randomly selected unit graphic is prescribed to be a fixed ratio or bigger, the arrangement density of the patterns is uniform overall and a focus margin is improved. Furthermore, since an optimal arrangement density is prescribed by a value, it is easier to evaluate the quality of a pattern arrangement and the design man-hours are reduced.

According to a fourth aspect, there is provided a photomask onto which the hole patterns and the auxiliary patterns arranged by any one of the methods of designing hole patterns described above are transferred.

In the present invention, since the arrangement of hole patterns and auxiliary patterns are decided by any one of the layout design methods described above, a photomask with an improved focus margin is produced, the exposure process becomes easier, and the working hours are reduced.

The meritorious effects of the present invention are summarized as follows.

With the method of designing hole patterns according to the present invention, it is possible to fine-tune the distances between the hole patterns, which would have been too wide under the conventional technology. As a result, the uniformity of the overall optical conditions for a pattern drawing improves and so does its focus margin.

Furthermore, since it becomes easier to evaluate the quality of each pattern arrangement of hole patterns and auxiliary patterns, the design man-hours are reduced.

PREFERRED EMBODIMENTS OF THE INVENTION

A method of designing hole patterns according to the present invention provides a grid with a space smaller than a minimum pitch allowed by a design rule, and provides hole patterns at lattice points, which are the intersections of the grid. Also, some forbidden values of area density, etc. are applied when patterns are being arranged.

Embodiment 1

A method of designing hole patterns according to the present invention will be described below. In the present embodiment, a minimum pitch allowed by a design rule for designing patterns of a photomask used during an exposure process in semiconductor integrated circuit manufacturing is the densest pitch of hole patterns.

Figure 1A:
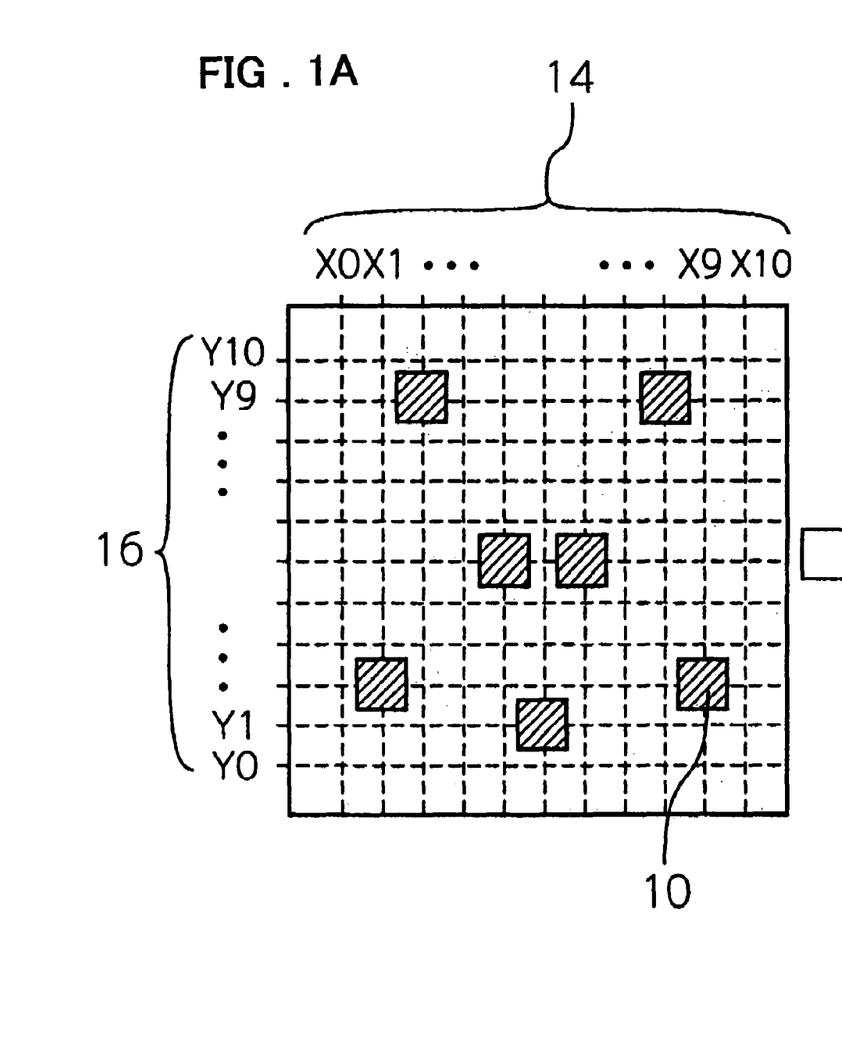
FIGS. 1A and 1B show pattern drawings demonstrating a hole pattern design method according to Embodiment 1.
Figure 1B:
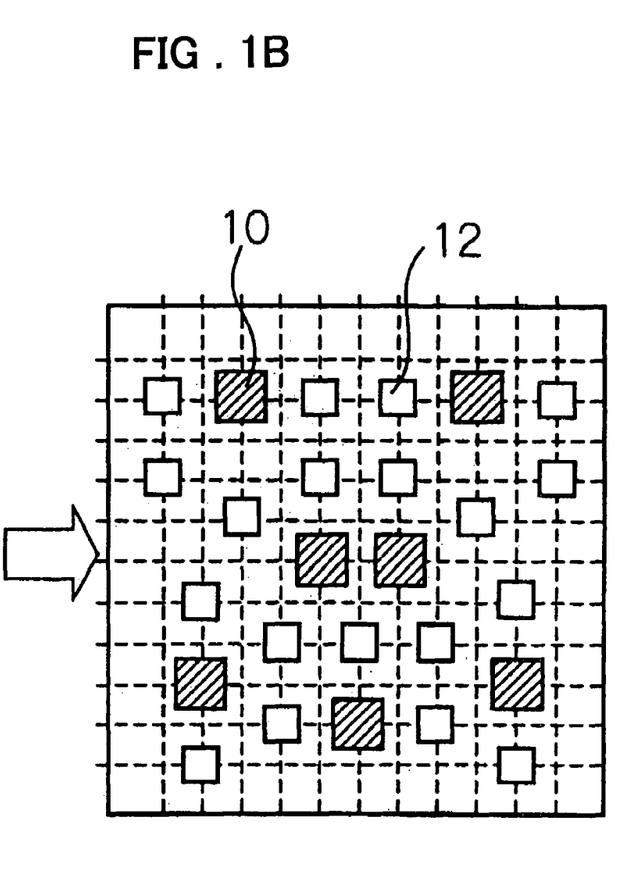

FIG. 1 shows pattern drawings showing a method of designing hole patterns on a photomask.

In FIG. 1A, the lateral direction is called X direction and the vertical direction Y direction. As shown in FIG. 1A, a grid with uniformly spaced multiple lines in X and Y directions (coordinates) is provided on the pattern drawing. The space of grid is smaller than the densest pitch of hole patterns 10. In the present embodiment, the space of the grid is half of the densest pitch of the hole pattern 10. Hereinafter, the space of grid is called "grid size", and size of "grid size" multiplied by n (n is an integer) is indicated as "n grid sizes". Furthermore, this grid is provided for designing hole patterns and is not transferred onto the photomask.

As shown in FIG. 1A, 11 lines each are provided in both directions as X direction grid 14 and Y direction grid 16, and the X direction grid 14 are numbered as X0 through X10 and the Y direction grid 16 as Y0 through Y10.

Then, as shown in FIG. 1A, hole patterns are arranged so that the gravity centers of the hole patterns are located at the lattice points, which are the intersections of the grid. Since the densest pitch of the hole pattern 10 corresponds to 2 grid sizes, the distance connecting two gravity centers of the hole patterns 10 must be not less than 2 grid sizes when arranging the hole patterns 10.

Then, the auxiliary patterns 12 are provided at available lattice points so that the arrangement density of the hole patterns 10 and the auxiliary patterns 12 becomes more uniform. The auxiliary pattern 12 is smaller than the hole pattern 10 in size, and is a pattern that is not transferred onto a photoresist layer during an exposure process. In order to secure a focus margin during the exposure process, the auxiliary patterns 12 must be arranged matching the position with highest pattern density when arranging the auxiliary patterns 12. As shown in FIG. 1A, since the distance between the patterns where the pattern density is highest is 2 grid sizes, the auxiliary patterns 12 are arranged so that the respective pitch of the hole patterns 10 and auxiliary patterns 12 is not less than 2 grid size (FIG. 1B). Note that it is advisable to have the respective pitch of the hole patterns 10 and auxiliary patterns 12 as close as possible to 2 grid sizes so that the influence of a proximity effect becomes more uniform.

After the pattern drawing shown in FIG. 1B is produced by the design method described above, a photomask according to the present invention is produced by transferring the pattern drawing without the grid onto a substrate such as a quartz substrate.

In a method of designing hole patterns according to the present invention, hole patterns are provided at the lattice points of a grid whose space is smaller than the minimum pitch allowed by the design rule, therefore the flexibility of hole pattern arrangement is improved, and it is possible to fine-tune the distances between the patterns where the space between the hole patterns tends to be too wide. As a result, the uniformity of the overall optical conditions for a pattern drawing improves compared to the conventional technology, and so does its focus margin. Furthermore, it becomes easier to optimize a layout with auxiliary patterns to unify the optical conditions than before. As a result, it is possible to reduce the design man-hours.

Furthermore, a photomask according to the present invention is a photomask with an improved focus margin since patterns are arranged by the design method described above. The exposure process becomes easier, and the working hours are reduced.

In the present embodiment, the densest pitch of the hole pattern is used as a standard and the space of the grid is specified as half of the densest pitch, however, spacing (pitch) of the grids can be decided using the densest pitch of other patterns, such as gate electrodes of transistors and wires connecting elements, as a minimum pitch of a design rule. Also, the minimum pitch of the exposure process resolution limit can be a minimum pitch of a design rule. The minimum pitch of the resolution limit corresponds to the length twice as long as the minimum processing size. For example, if the minimum processing size is 0.1 µm, the minimum pitch of the resolution limit is 0.2 µm. Furthermore, the spacing (pitch) of the grids doesn't have to be exactly half of the minimum pitch as long as it is smaller than the minimum pitch.

Embodiment 2

In the present embodiment, the degree of isolating property (discreteness) from other surrounding patterns is calculated for each pattern, and an optimal pattern arrangement is realized utilizing the degree of isolating property. In the present embodiment, as a value indicating the degree of isolating property, "discreteness rate" as defined below is used.

On a pattern drawing for a photomask, a resize process, where each pattern is enlarged by a prescribed multiplier centering the gravity center, is carried out, and similar patterns, which are patterns resulted from the resize process on each pattern, are virtually created. Hereinafter, an object pattern whose discreteness rate is being calculated is called "reference pattern", and patterns surrounding the reference pattern are called "peripheral patterns". Furthermore, a similar pattern of the reference pattern is called "reference similar pattern", and a similar pattern of peripheral pattern is called "peripheral similar pattern".

Then, the distance between the reference similar pattern and the peripheral similar pattern is measured, and the ratio of how much the reference similar pattern is separated from the peripheral similar pattern becomes "discreteness rate." The length of a part of a side of the reference similar pattern that dose not overlap with the peripheral similar pattern is measured, and the discreteness rate is calculated (the length of the non-overlapping side/the total length of the side).

Note that in the case where a side of the reference similar pattern comes in contact with a side of the peripheral similar pattern, it does not mean that they are overlapping. In the case where the reference similar pattern does not overlap with the peripheral similar pattern, the discreteness rate is 1 since the ratio of how much the reference similar pattern is separated from the peripheral similar pattern is 100%.

Next, using a hole pattern as a reference pattern, the discreteness rate described above is explained in detail. A peripheral pattern can be either a hole pattern or auxiliary pattern. Also, the multiplier of the resize process used here is 3.

Figure 2A:
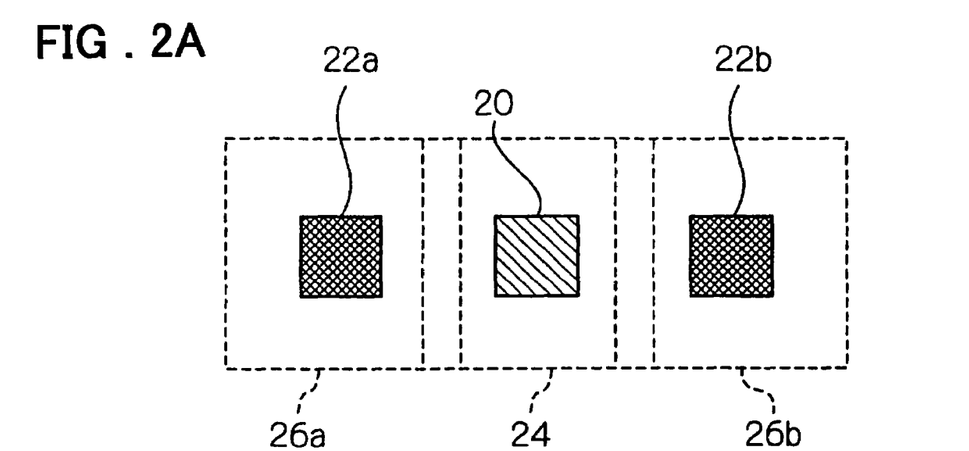
FIGS. 2A, 2B and 2C show pattern drawings showing examples of arranging reference patterns and peripheral patterns.
Figure 2B:
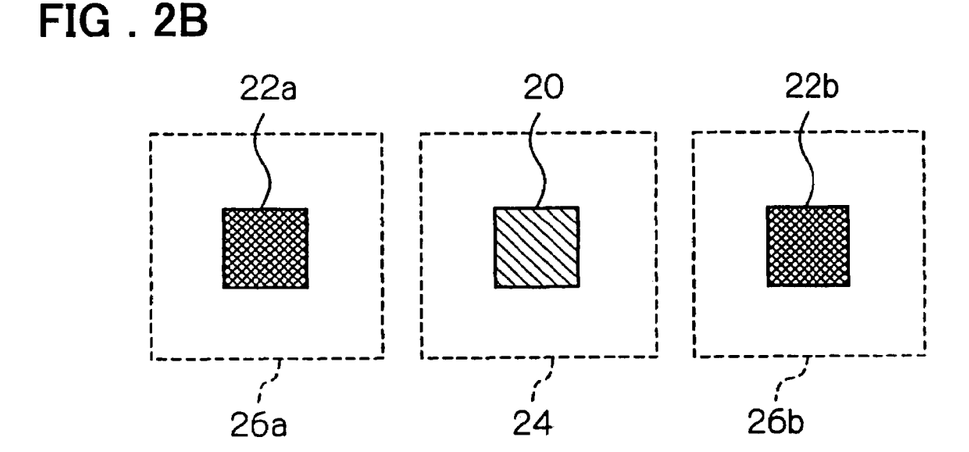
Figure 2C:
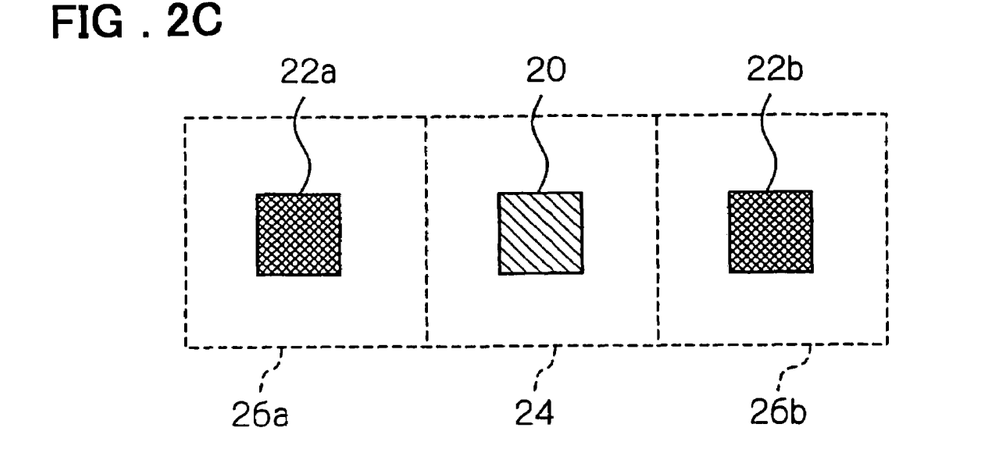

FIGS. 2A through 2C are pattern drawings showing arrangement examples of a reference pattern and peripheral patterns. When the resize process is carried out on the reference pattern 20, it becomes a reference similar pattern 24. Also, when the resize process is carried out on peripheral patterns 22a and 22b, they become peripheral similar patterns 26a and 26b, respectively.

In the case of FIG. 2A, one out of the four sides of the reference similar pattern 24 overlaps with the peripheral similar pattern 26a, and another side overlaps with the peripheral similar pattern 26b. Therefore, the discreteness rate=½.

In the case of FIG. 2B, the reference similar pattern 24 does not overlap with either of the peripheral similar patterns 26a or 26b, thus, the discreteness rate=1.

In the case of FIG. 2C, one out of the four sides of the reference similar pattern 24 comes in contact with the peripheral similar pattern 26a, and another side comes in contact with the peripheral similar pattern 26b. When a side comes in contact with another, it is not overlapping with it. Therefore, the discreteness rate=1 in this case as well.

Next, more concrete examples of discreteness rate are described using other pattern arrangement examples.

Figure 3A:
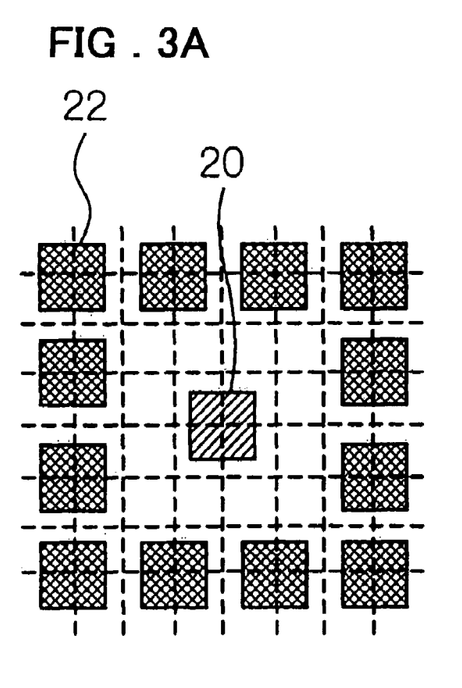
FIGS. 3A, 3B and 3C show pattern drawings showing other examples of arranging reference patterns and peripheral patterns.
Figure 3B:
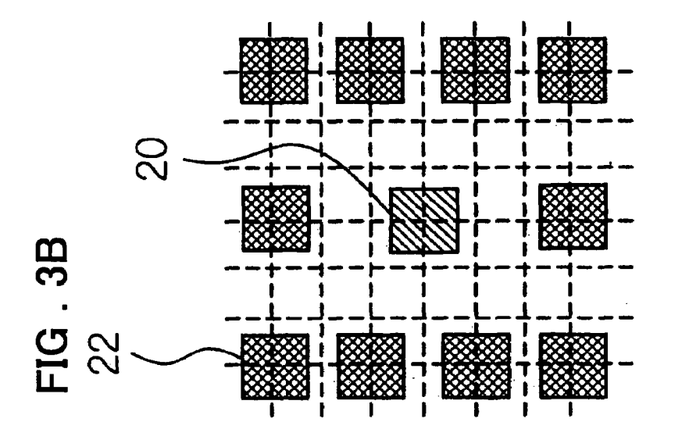
Figure 3C:
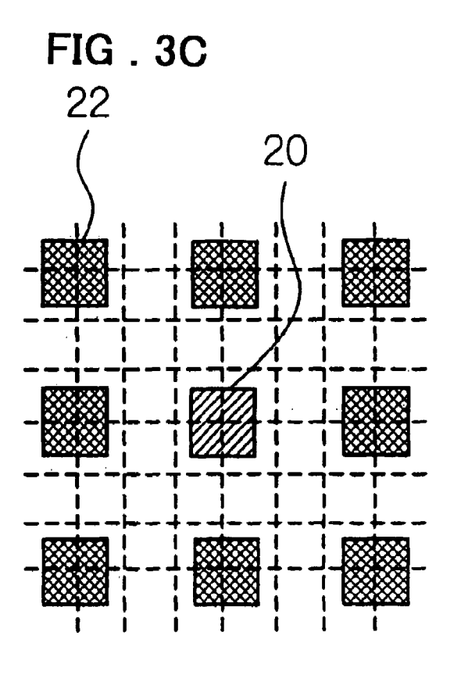

FIGS. 3A through 3C are pattern drawings showing other arrangement examples of a reference pattern and a peripheral pattern.

It appears that the isolating property of a reference pattern 20 becomes bigger in the following order: FIGS. 3A, 3B, and 3C. When the reference pattern 20 and a peripheral pattern 22 are enlarged 3 times centering the gravity center of each pattern, a similar pattern of the reference pattern 20 comes in contact with a side of a similar pattern of the peripheral pattern 22 in all the cases shown in FIGS. 3A through 3C. Therefore, the discreteness rate of the reference pattern 20 shown in FIG. 3 is always 1.

The focus margins of multiple examples of pattern arrangement were measured using the discreteness rate calculation method described above and the results are explained below. A simulation was carried out under the following conditions: the wavelength of the light source=193 nm, NA=0.78, σ=0.85, ring illumination, transmittance 6%, and halftone type. The aperture size of a reference pattern is 0.1 µm×0.1 µm, and the densest pitch is 0.2 µm.

Figure 4:
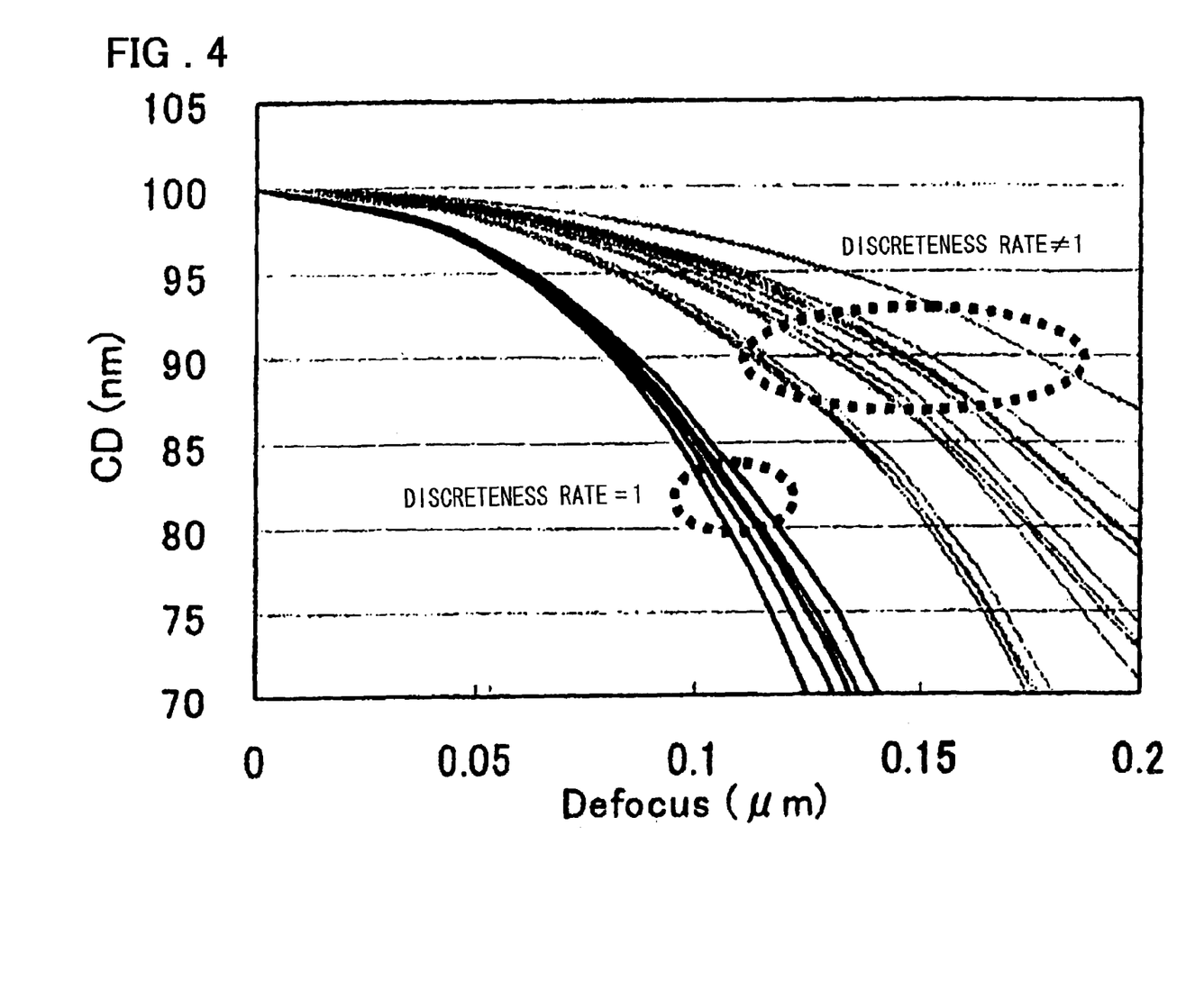
FIG. 4 is a graph showing dimension-defocus characteristics.

FIG. 4 is a graph showing dimension-defocus characteristics. The vertical axis (ordinate) of the graph indicates critical dimension (CD) and the horizontal axis (abscissa) indicates defocus amount (the amount of focus shift).

As shown in FIG. 4, the bigger defocus amount becomes, the smaller than a target dimension the dimension of reference pattern photoresist becomes. With the same defocus amount, the dimension is further away from a target dimension in the case where the discreteness rate is equal to 1 than the case where the discreteness rate is not equal to 1. For example, comparing the dimensions of reference pattern at the defocus amount of 0.1 µm, when the discreteness rate is 1, the dimension is 84-87 nm. On the other hand, when the discreteness rate is not 1, it ranges 93-97 nm.

Figure 5:
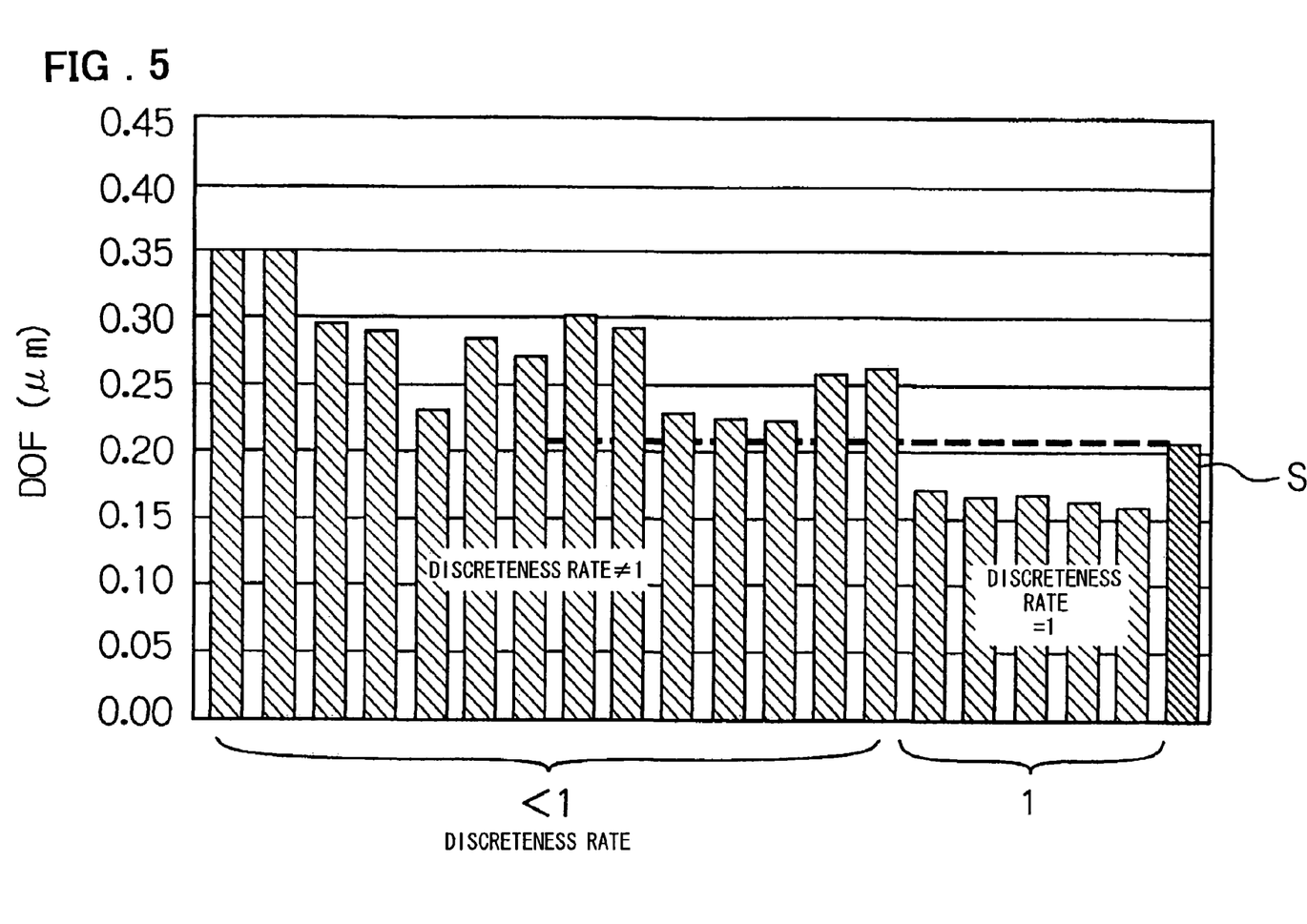
FIG. 5 is a graph showing the relationship between the depth of focus and the discreteness rate in multiple examples of pattern arrangement.

FIG. 5 is a graph showing the relationship between the depth of focus (DOF) and the discreteness rate in several pattern arrangement examples. The vertical axis of the graph indicates depth of focus (DOF) and the horizontal axis indicates discreteness rate. The rightmost bar S shown in the graph indicates a case where peripheral patterns are arranged around a reference pattern so that the optimum optical conditions are achieved, and a broken line drawn from the top of the bar S indicates the depth of focus in such a case.

As shown in FIG. 5, in the cases where the discreteness rate is not equal to 1, the depth of focus is always about 0.2 μm or more, and at any discreteness rate, the depth of focus is above the broken line. On the other hand, in the cases where the discreteness rate is equal to 1, the depth of focus is approximately 0.17 μm and below the amount indicated by the broken line.

As shown in FIGS. 4 and 5, patterns with the discreteness rate equal to 1 and patterns with the discreteness rate unequal to 1 differ in defocus characteristic and the depth of focus. In patterns with the discreteness rate equal to 1, there is not a sufficient focus margin. On the other hand, in patterns with the discreteness rate unequal to 1(<1), there is a sufficient focus margin.

As described above, the degree of isolating property (discreteness) of a hole pattern is calculated, and layouts where the isolating property is high and the auxiliary patterns described above cannot be arranged are forbidden.

In the present invention, a focus margin can be secured by making a side of a similar pattern of each pattern overlap with other similar patterns.

Furthermore, a layout where no focus margin can be secured by any means must be forbidden, however, it easy to decide to allow or forbid a pattern arrangement by using the discreteness rate described above. As a result, a focus margin for a whole hole pattern group can be secured.

If hole patterns are provided at the lattice points of the grid described in Embodiment 1, calculating the degree of isolating property for each pattern becomes easy. As a result, optimizing layouts with auxiliary patterns becomes easy as well, and so does evaluating the quality of pattern arrangement. Consequently, the design man-hours are reduced.

Furthermore, since patterns are arranged by the design method described above on a photomask according to the present invention, a photomask with an improved focus margin is produced, the exposure process becomes easier, and the working hours are reduced.

Embodiment 3

In the present embodiment, a optimum value of hole density, which is the area density of hole patterns within a prescribed area, is calculated and applied to a hole pattern design method.

The hole density according to the present invention is explained below.

Figure 6A:
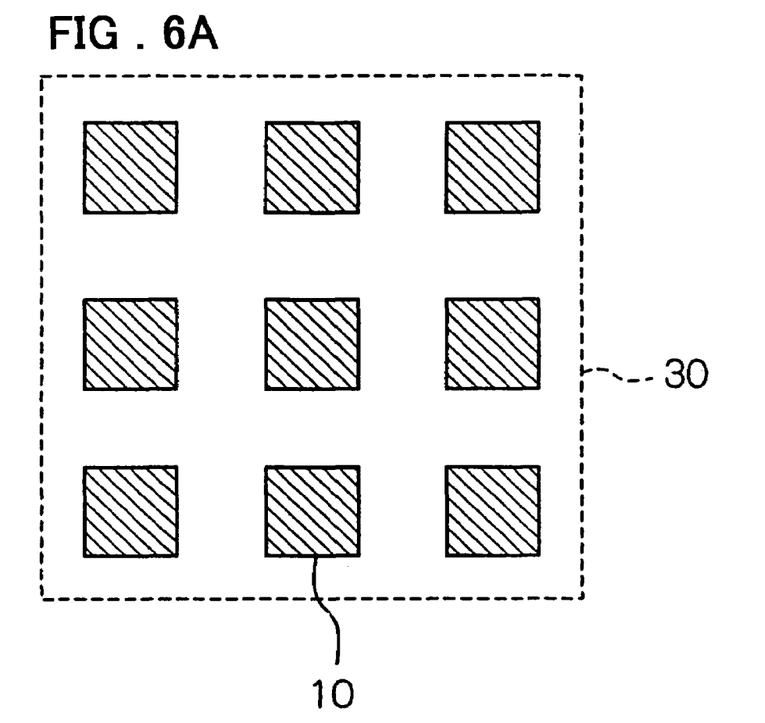
FIGS. 6A and 6B show pattern drawings for explaining the hole density.
Figure 6B:
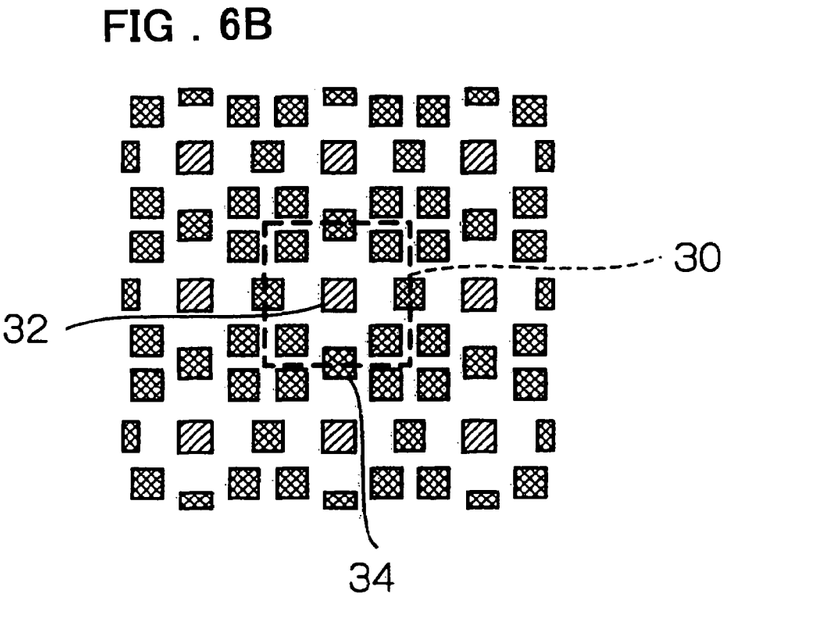

FIG. 6 shows pattern drawings for explaining hole density. FIG. 6A shows an example where a maximum number of hole patterns are provided within a unit graphic. FIG. 6B shows a figure showing a pattern arrangement example for calculating hole density.

As shown in FIG. 6A, the unit graphic 30 is a square with a side three times as long as the densest pitch of hole patterns 10, therefore, the maximum number of the hole patterns 10 that can be provided within the unit graphic 30 is 9. In the present embodiment, in order to secure a focus margin (>0.2 μm), the number of the hole patterns 10 provided within the unit graphic 30 must be not less than 5.4 according to the graph, i.e. 6 or more in terms of the number of the hole patterns per unit graphic. Therefore, an optimum value of hole density is a value not less than 0.6. The pattern drawing shown in FIG. 6A is the densest layout where the hole density equals 1. A concrete example is given and described below using a hole pattern as a reference pattern.

As shown in FIG. 6B, if a unit graphic 30 is placed at the gravity center of a reference pattern 32, one reference pattern 32 is enclosed within the unit graphic 30. Furthermore, six peripheral patterns (=4+(½)×4) are included (covered) altogether. If the peripheral patterns 34 are replaced with the reference patterns 32, seven reference patterns 32 are included within the unit graphic 30. Therefore, the hole density of the unit graphic 30 is calculated as follows: $7/9=0.78$. This value of hole density corresponds to 78% of the area where the maximum number of the reference patterns are provided within the unit graphic, and it meets the condition of 60% or more.

Next, the relationship between the discreteness rate described in Embodiment 2 and the hole density is explained.

Figure 7:
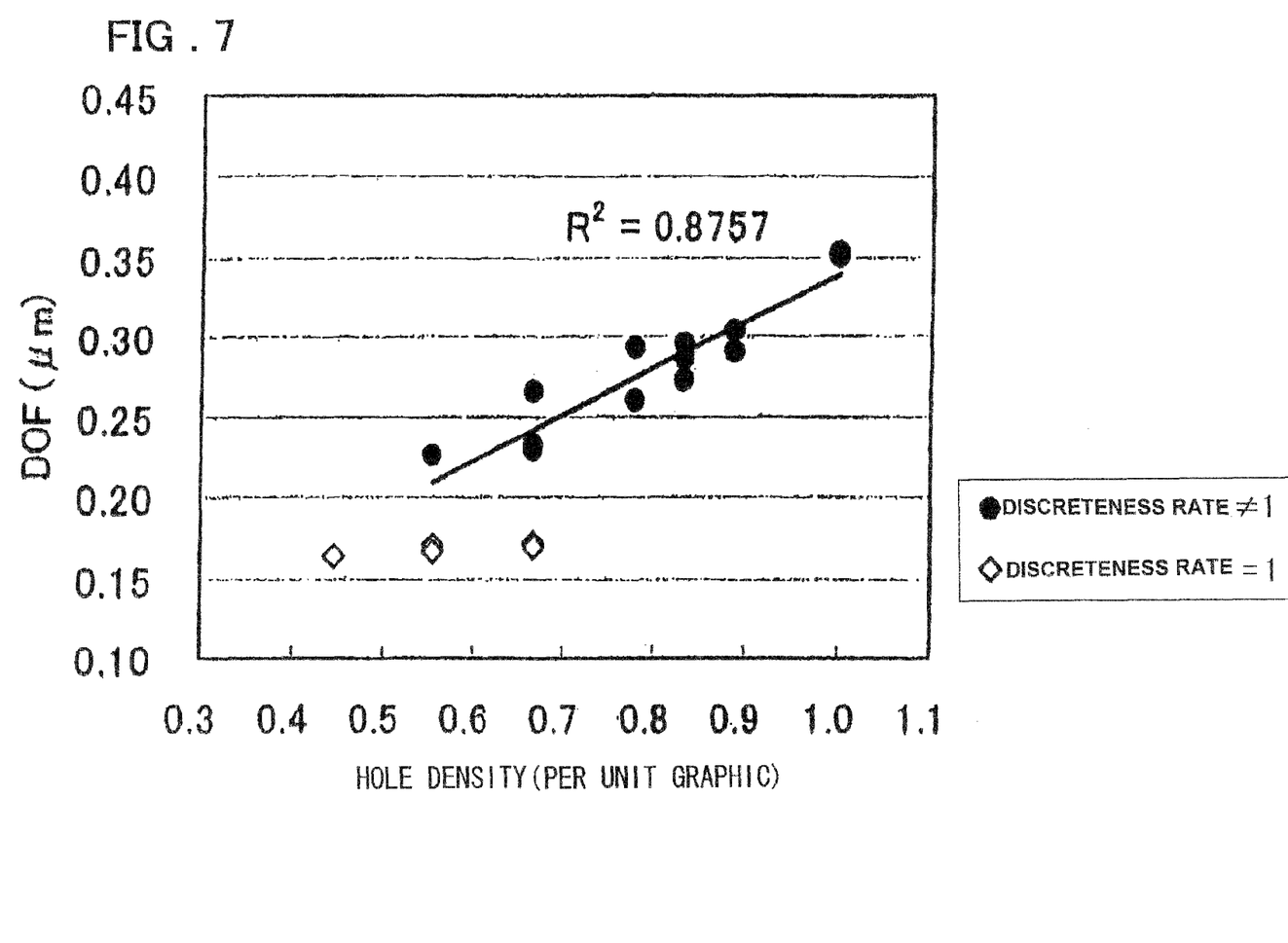
FIG. 7 is a graph showing the relationship between the hole density and the depth of focus.

FIG. 7 is a graph showing the relationship between the hole density and the depth of focus (DOF).

As shown in FIG. 7, patterns with the discreteness rate equal to 1 show more or less the same depth of focus value regardless of the hole density value. On the other hand, for patterns with the discreteness rate unequal to 1, as the hole density gets bigger, the depth of focus gets bigger as well, meaning the focus margin is more or less proportional to the hole density.

From the results shown in FIG. 7, layouts that are forbidden because of their insufficient focus margins are: first, a layout with the discreteness rate equal to 1, second, a layout where the hole density is less than a prescribed value. By meeting the conditions of Embodiment 2 and the conditions of the present embodiment, the focus margin becomes even broader. Further, layouts where the hole density is less than 0.6 are forbidden.

In the present embodiment, similar effects can be obtained as in Embodiment 2, and by applying the fact that the hole density is proportional to the depth of focus to a hole pattern design method, a design that broadens the focus margin even more is possible.

Note that the definitions of the discreteness rate and hole density don't have to be exactly as described above in Embodiment 2 and 3. For example, the calculation of the discreteness rate can be weighted by the direction, and the area of the hole density calculation can be varied.

Furthermore, the explanation was made using a hole pattern as the reference pattern, however, the reference pattern can be either a hole pattern or auxiliary pattern. The peripheral pattern can also be either a hole pattern or auxiliary pattern.

It should be noted that other objects, features and aspects of the present invention will become apparent in the entire disclosure and that modifications from the disclosed embodiments may be done without departing the scope of the present invention claimed as appended herewith.

Also it should be noted that any combination of the disclosed and/or claimed elements, matters and/or items may fall under the modifications aforementioned.

What is claimed is:

1. A method of designing hole patterns for arranging hole patterns on a pattern drawing of a photomask used during an exposure process in semiconductor integrated circuit manufacturing, the method comprising:
providing a grid on a pattern drawing with a space smaller than a minimum pitch allowed by a design rule of said semiconductor integrated circuit, and
providing said hole patterns at lattice points, which are the intersections of said grid.

2. The method of designing hole patterns as defined in claim 1 wherein the space of said grid is half of said minimum pitch.

3. The method of designing hole patterns as defined in claim 1 wherein auxiliary patterns, which are patterns not transferred onto a photoresist layer during said exposure process, are provided at lattice points located at a distance not less than said minimum pitch from a gravity center in each of said hole patterns, excluding the lattice points at which said hole patterns are provided.

4. The method of designing hole patterns as defined in claim 3 wherein the space of said grid is half of said minimum pitch.

5. A photomask onto which said hole patterns and said auxiliary patterns arranged by a method of designing hole patterns as defined in claim 3 are transferred.

6. A method of designing hole patterns for arranging hole patterns and auxiliary patterns on a pattern drawing of a photomask used during an exposure process in semiconductor integrated circuit manufacturing,
the method comprising:
providing hole patterns on a pattern drawing of a photomask, and providing auxiliary patterns on said pattern drawing,
wherein said auxiliary patterns are not transferred onto a photoresist layer during an exposure process, and said hole patterns and said auxiliary patterns are arranged so that a side of a similar pattern which is obtained by enlarging each of said hole patterns and said auxiliary patterns by a prescribed multiplier, centering its gravity center so that each pattern overlaps with other similar patterns.

7. A method of designing hole patterns as defined in claim 6 wherein the value of said multiplier is 3.

8. A photomask onto which said hole patterns and said auxiliary patterns arranged by a method of designing hole patterns as defined in claim 6 are transferred.

9. A method of designing hole patterns for arranging hole patterns and auxiliary patterns on a pattern drawing of a photomask used during an exposure process in semiconductor integrated circuit manufacturing wherein the pattern of said auxiliary patterns are not transferred onto a photoresist layer during said exposure process, and said hole patterns and said auxiliary patterns are arranged so that when a unit graphic is a square whose side is three times as long as the densest pitch, which is the minimum value of the distance between gravity centers, one in each of said hole patterns, and when said auxiliary patterns are replaced by said hole patterns, the area of hole patterns within said unit graphic placed at an optional position on said pattern drawing is 60% or larger of the area of the maximum number of said hole patterns that can be arranged within said unit graphic.

10. A photomask onto which said hole patterns and said auxiliary patterns arranged by a method of designing hole patterns as defined in claim 9 are transferred.

* * * * *